United States Patent
Shimanuki

(10) Patent No.: US 7,408,252 B2
(45) Date of Patent: Aug. 5, 2008

(54) SEMICONDUCTOR DEVICE AND A MANUFACTURING METHOD OF THE SAME

(75) Inventor: Yoshihiko Shimanuki, Nanyou (JP)

(73) Assignee: Renesas Technology Corp., Tokyo (JP)

( * ) Notice: Subject to any disclaimer, the term of this patent is extended or adjusted under 35 U.S.C. 154(b) by 69 days.

(21) Appl. No.: 11/378,449

(22) Filed: Mar. 20, 2006

(65) Prior Publication Data

US 2006/0220221 A1    Oct. 5, 2006

(30) Foreign Application Priority Data

Mar. 18, 2005    (JP) .............................. 2005-078581

(51) Int. Cl.
*H01L 23/02* (2006.01)
(52) U.S. Cl. ...................... 257/678; 257/698
(58) Field of Classification Search .................. 257/698, 257/114, E23.011, 678
See application file for complete search history.

(56) References Cited

U.S. PATENT DOCUMENTS

| | | | |
|---|---|---|---|
| 4,770,900 A * | 9/1988 | Seibel | 430/314 |
| 2004/0227227 A1 * | 11/2004 | Imanaka et al. | 257/700 |
| 2005/0140007 A1 * | 6/2005 | Jobetto | 257/738 |
| 2005/0140023 A1 * | 6/2005 | Kinoshita et al. | 257/778 |
| 2005/0212110 A1 * | 9/2005 | Kato | 257/686 |
| 2006/0017151 A1 * | 1/2006 | Yoon et al. | 257/700 |

FOREIGN PATENT DOCUMENTS

| JP | 2001284491 A | * 10/2001 |
|---|---|---|
| JP | 2003-092374 | 3/2003 |

* cited by examiner

*Primary Examiner*—Douglas M Menz
(74) *Attorney, Agent, or Firm*—Antonelli, Terry, Stout & Kraus, LLP.

(57) ABSTRACT

The present invention enhances the reliability of a semiconductor device. The semiconductor device includes a package substrate having a dry resist film which covers some conductive portions out of a plurality of conductive portions formed on a main surface and a back surface and is formed of a film, a semiconductor chip which is mounted over the package substrate, conductive wires which electrically connect the semiconductor chip with the package substrate, a die-bonding film which is arranged between the main surface of the package substrate and the semiconductor chip, a plurality of solder bumps which are formed on the back surface of the package substrate, and a sealing body which is made of resin. By forming the dry resist film made of a film on the main surface and the back surface of the package substrate, it is possible to suppress the warping of the package substrate and hence, the occurrence of package cracks at the time of reflow mounting can be prevented thus enhancing the reliability of the semiconductor device.

8 Claims, 17 Drawing Sheets

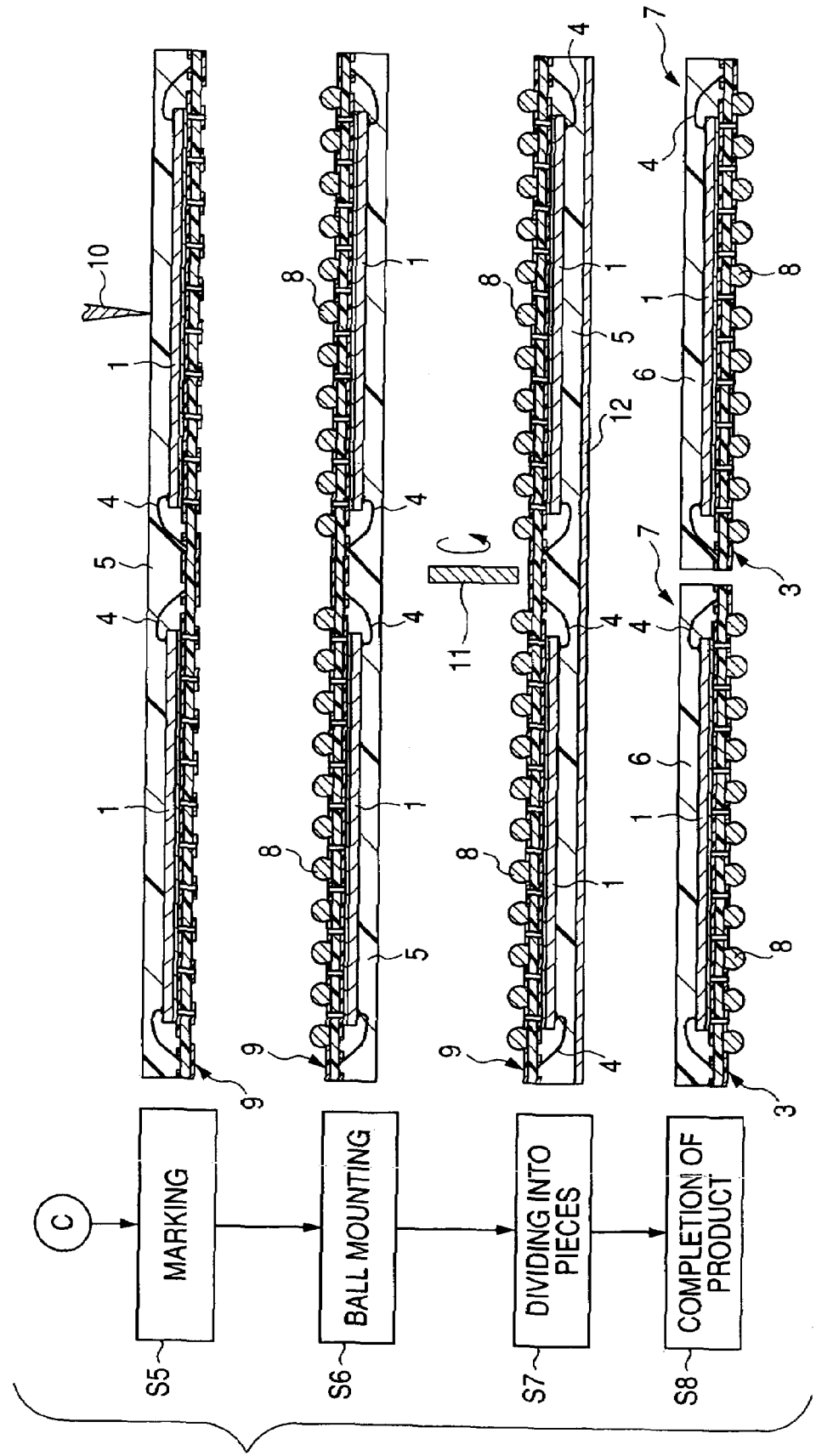

SEMICONDUCTOR DEVICE AND A MANUFACTURING METHOD OF THE SAME

CROSS-REFERENCE TO RELATED APPLICATION

The present application claims priority from Japanese patent application No. 2005-078581 filed on Mar. 18, 2005, the content of which is hereby incorporated by reference into this application.

BACKGROUND OF THE INVENTION

The present invention relates to a semiconductor manufacturing technique, and more particularly to a technique which is effectively applicable to the enhancement of the reliability of a semiconductor device.

In a semiconductor device which fixes a semiconductor chip on a printed wiring board by way of an adhesive material, grooves from which an insulation film is removed are provided between the semiconductor chip and electrodes on a main surface of the printed wiring board and hence, a flow-out portion of the adhesive material stays inside the grooves and does not reach the electrodes on the main surface of the printed wiring board. The grooves are formed by removing the insulation film over the whole depth region (see, for example, Japanese Unexamined Patent Publication 2003-92374 (FIG. 1) (patent document 1).

SUMMARY OF THE INVENTION

Mainly, a wet-type resist film is, formed on front and back surfaces of a printed wiring board. The wet-type resist film has fluidity and is formed by coating and hence, it is difficult to form the film having a uniform film thickness. That is, in the wet-type resist film, the film thickness becomes non-uniform or irregular and hence, a printed wiring board is warped. Further, since the wet-type resist film is formed by coating, foreign substances (waste thread) or the like are liable to be easily entangled and this entanglement causes a defective operation of the printed wiring board.

As a countermeasure to cope with the warping of the printed wiring board, there has been proposed a method in which rates of copper wiring formed on front and back surfaces of the printed wiring board are made as equal as possible thus suppressing the warping in an initial state. However, while there exists a strong demand for the miniaturization and the reduction of thickness of the semiconductor device, there exist many restrictions with respect to the copper wiring on the printed wiring board such as the pull-around of the copper wiring and hence, it is difficult to make equal the rates of the copper wiring formed on the front and back surfaces of the printed wiring board. Accordingly, it is difficult to suppress the warping using such a method.

Here, when the printed wiring board is warped in a U shape, there arises a drawback that voids are generated in a lower portion of the semiconductor chip and a package crack occurs at the time of reflow mounting, for example, at the time of mounting the semiconductor device after assembling the semiconductor device.

Further, when the printed wiring board is warped in an inverse-U-shape, there arises a drawback that the peeling-off occurs between the chip and the substrate on an outer periphery of the chip.

Further, when the printed wiring board is warped, ultrasonic waves which are generated at the time of performing the wire bonding are not normally transmitted to the board thus giving rise to a drawback of defective bonding.

Further, when the printed wiring board is warped, this warping also may cause a trouble on the transportation system.

Still further, with respect the wet-type resist film, a film thickness thereof becomes irregular thus forming an uneven surface and hence, it is difficult to use a film-like die-bonding material as a die-bonding material. That is, the die-bonding film does not conform to the uneven surface of the wet-type resist film and hence, voids are generated between the recessed portion of the wet-type resist film and the die-bonding film thus leading to a package crack.

Accordingly, although the wet-type resist film adopts a paste material as the die-bonding material, in using the paste material, it is necessary to prevent the contamination of bonding terminals of the printed wiring board attributed to the leaking of the paste material from the semiconductor chip. Accordingly, it is necessary to ensure a sufficient distance from an end portion of the semiconductor chip to an end portion of the printed wiring board. As a result, it is necessary for the printed wiring board to ensure a sufficient area in a region outside the semiconductor chip thus giving rise to a drawback that it is impossible to achieve the miniaturization of the semiconductor device.

Accordingly, it is an object of the present invention to provide a technique which can enhance the reliability of a semiconductor device.

It is another object of the present invention to provide a technique which can enhance the quality of the semiconductor device.

It is still another object of the present invention to provide a technique which can miniaturize the semiconductor device.

The above-mentioned and other objects and novel features of the present invention will become apparent from the description of this specification and attached drawings.

To briefly explain the summary of typical inventions among inventions disclosed in this specification, they are as follows.

That is, the present invention discloses a semiconductor device which includes a printed wiring board having a main surface, a back surface which faces the main surface in an opposed manner, a plurality of conductor portions which are formed on the main surface and the back surface, and a dry resist film which is formed on the main surface and the back surface, covers some conductor portions out of the plurality of conductor portions and is formed of a film, a semiconductor chip which is mounted on the main surface of the printed wiring board, and a die-bonding film which is arranged between the main surface of the printed wiring board and the semiconductor chip, wherein the semiconductor chip is fixed to the dry resist film on the main surface of the printed wiring board by way of the die-bonding film.

Further, the present invention discloses a semiconductor manufacturing method which includes the steps of preparing a printed wiring board which has a main surface, a back surface which faces the main surface in an opposed manner, a plurality of conductor portions which are formed on the main surface and the back surface, and a dry resist film which is formed on the main surface and the back surface, covers some conductor portions out of the plurality of conductor portions and is formed of a film, connecting a semiconductor chip to the main surface of the printed wiring board by way of a die-bonding film, and electrically connecting the semiconductor chip with the printed wiring board, and sealing the semiconductor chip, wherein the semiconductor chip is fixed to the dry resist film on the main surface of the printed wiring board by way of the die-bonding film.

To briefly explain advantageous effects obtained by typical inventions among the inventions disclosed in this specification, they are as follows.

By forming the dry resist film which is formed of the film on the main surface and the back surface of the printed wiring board, the dry resist film is leveled and hence, it is possible to suppress the warping of the printed wiring board. As a result, it is possible to prevent the formation of voids below the chip and hence, the occurrence of package cracks can be prevented at the time of reflow mounting. Accordingly, it is possible to enhance the reliability and the quality of the semiconductor device. Further, by forming the dry resist film which is formed of the film on the main surface and the back surface of the printed wiring board, it is possible to level the main surface and the back surface and hence, it is possible to fix the semiconductor chip to the dry resist film on the printed wiring board of the semiconductor device by way of the die-bonding film. Accordingly, it is unnecessary to take the flow-out of a paste material from the semiconductor chip into consideration and hence, the distance from an end portion of the semiconductor chip to an end portion of the printed wiring board can be made as short as possible thus achieving the miniaturization of the semiconductor device.

BRIEF DESCRIPTION OF THE DRAWINGS

FIG. 24 is a manufacturing process flowchart showing a modification of assembling after resin molding in the assembling of the semiconductor device shown in FIG. 1.

DESCRIPTION OF THE PREFERRED EMBODIMENTS

In embodiments which will be explained hereinafter, unless otherwise specified, the explanation of same parts or similar parts are not repeated in principle.

Further, in the embodiments described hereinafter, when it is necessary for the convenience sake, the invention is explained by dividing the invention into a plurality of sections or embodiments. However, unless otherwise explicitly described, these sections or embodiments are not irrelevant to each other, wherein there exists a relationship that one section or embodiment is a modification, a detail, a complementary explanation of a portion or the whole of other section or embodiment.

Further, in the embodiments described hereinafter, when the number of elements and the like (including pieces, numerical values, quantity, range and the like) are referred to, unless otherwise particularly specified or the number is apparently limited to a specified number in principle, the number is not limited to the specified number and may be set to a value which is larger or lower than the specified number.

Embodiments of the present invention are explained in detail in conjunction with drawings. Here, in all drawings for explaining the embodiments, members having the same functions are given same symbols and the repeated explanation of the members is omitted.

Embodiment 1

Figure 1:
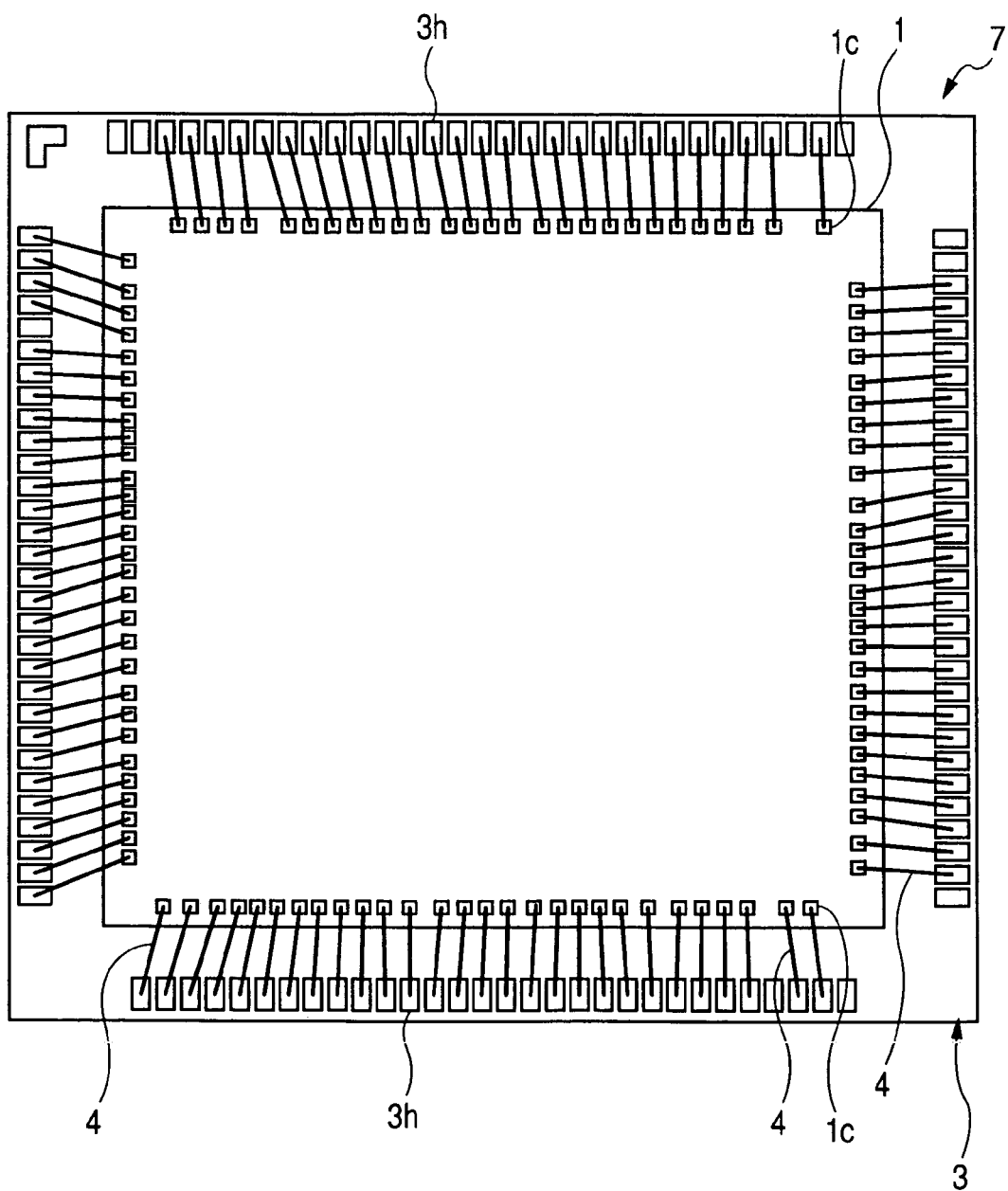
FIG. 1 is a plan view showing one example of the structure of a semiconductor device according to an embodiment 1 of the present invention as viewed through a sealing body in a see-through manner.
Figure 2:
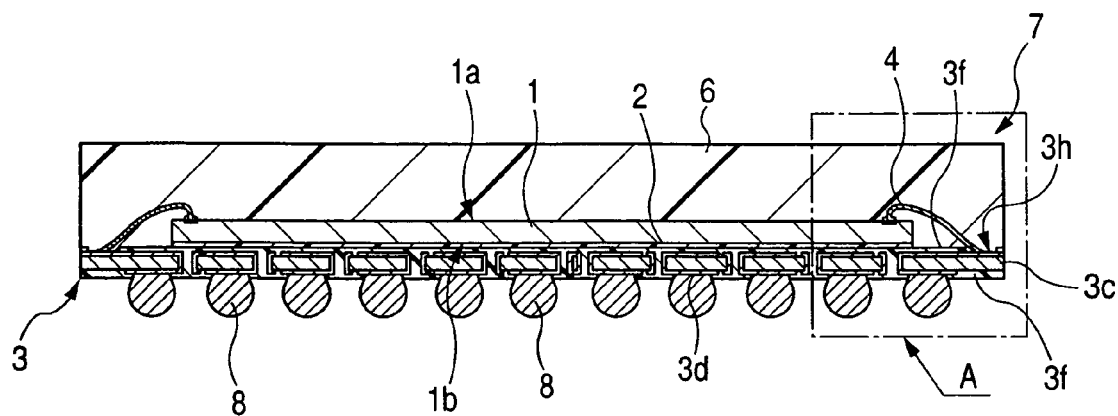
FIG. 2 is a cross-sectional view showing one example of the structure of the semiconductor device shown in FIG. 1.
Figure 3:
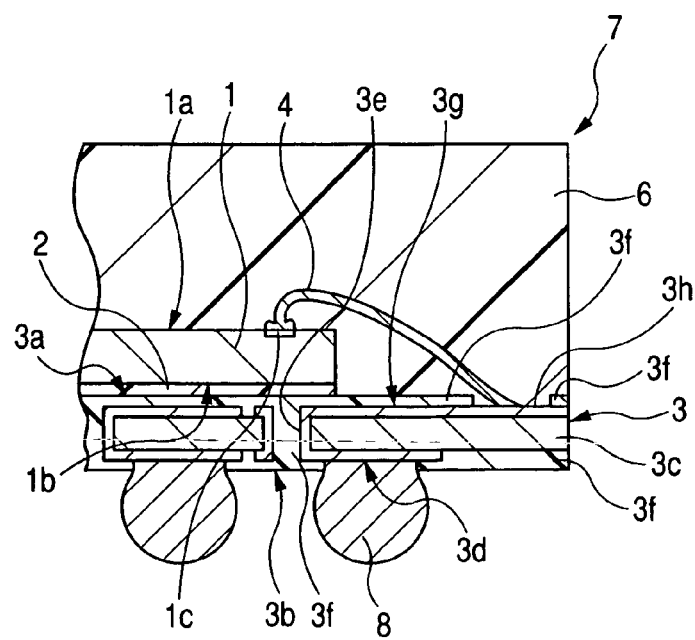
FIG. 3 is an enlarged partial cross-sectional view showing the structure of part A shown in FIG. 2.
Figure 4:
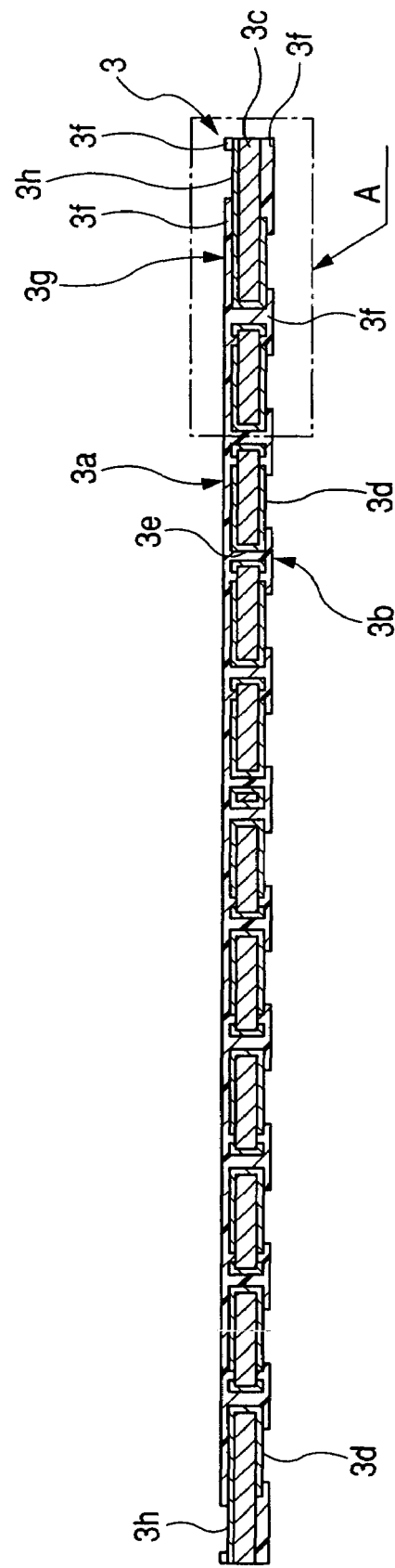
FIG. 4 is a cross-sectional view showing one example of the structure of a printed wiring board assembled in the semiconductor device shown in FIG. 1.
Figure 5:
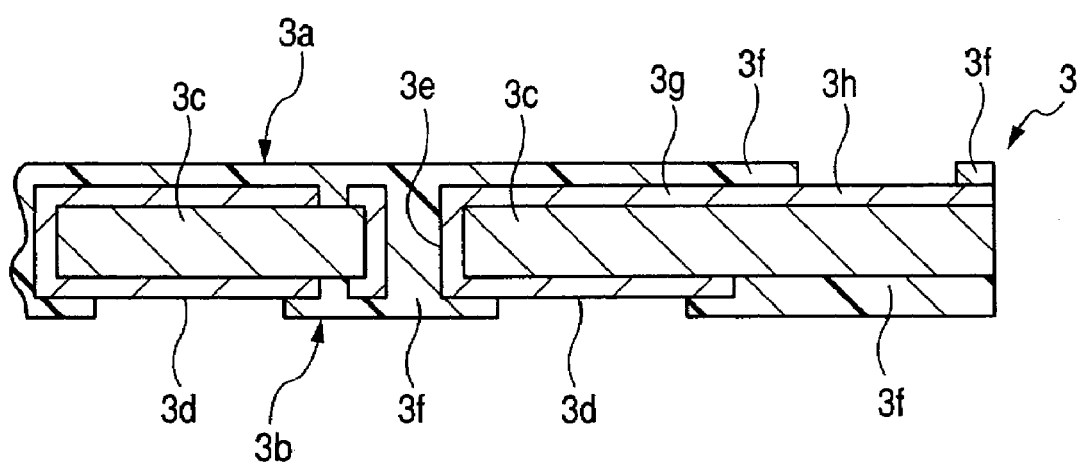
FIG. 5 is an enlarged partial cross-sectional view showing the structure of a part A shown in FIG. 4.

FIG. 1 is a plan view showing one example of the structure of a semiconductor device according to an embodiment 1 of the present invention as viewed through a sealing body in a see-through manner, FIG. 2 is a cross-sectional view showing one example of the structure of the semiconductor device shown in FIG. 1, FIG. 3 is an enlarged partial cross-sectional view showing the structure of a part A shown in FIG. 2, FIG. 4 is a cross-sectional view showing one example of the structure of a printed wiring board assembled in the semiconductor device shown in FIG. 1, FIG. 5 is an enlarged partial cross-sectional view showing the structure of a part A shown in FIG.

Figure 6:
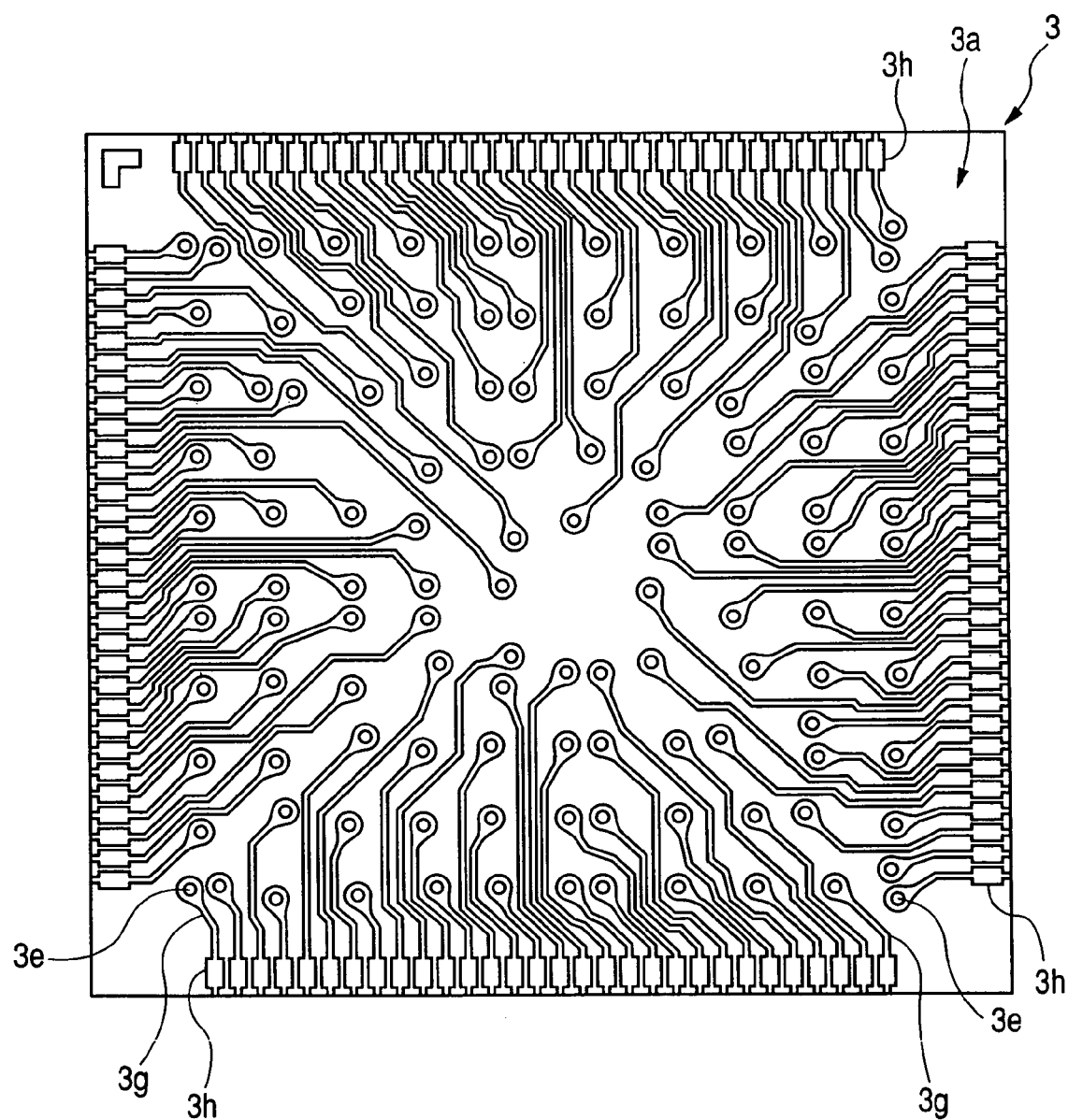
FIG. 6 is a plan view showing one example of a wiring pattern on a front surface side of the printed wiring board shown in FIG. 4.
Figure 7:
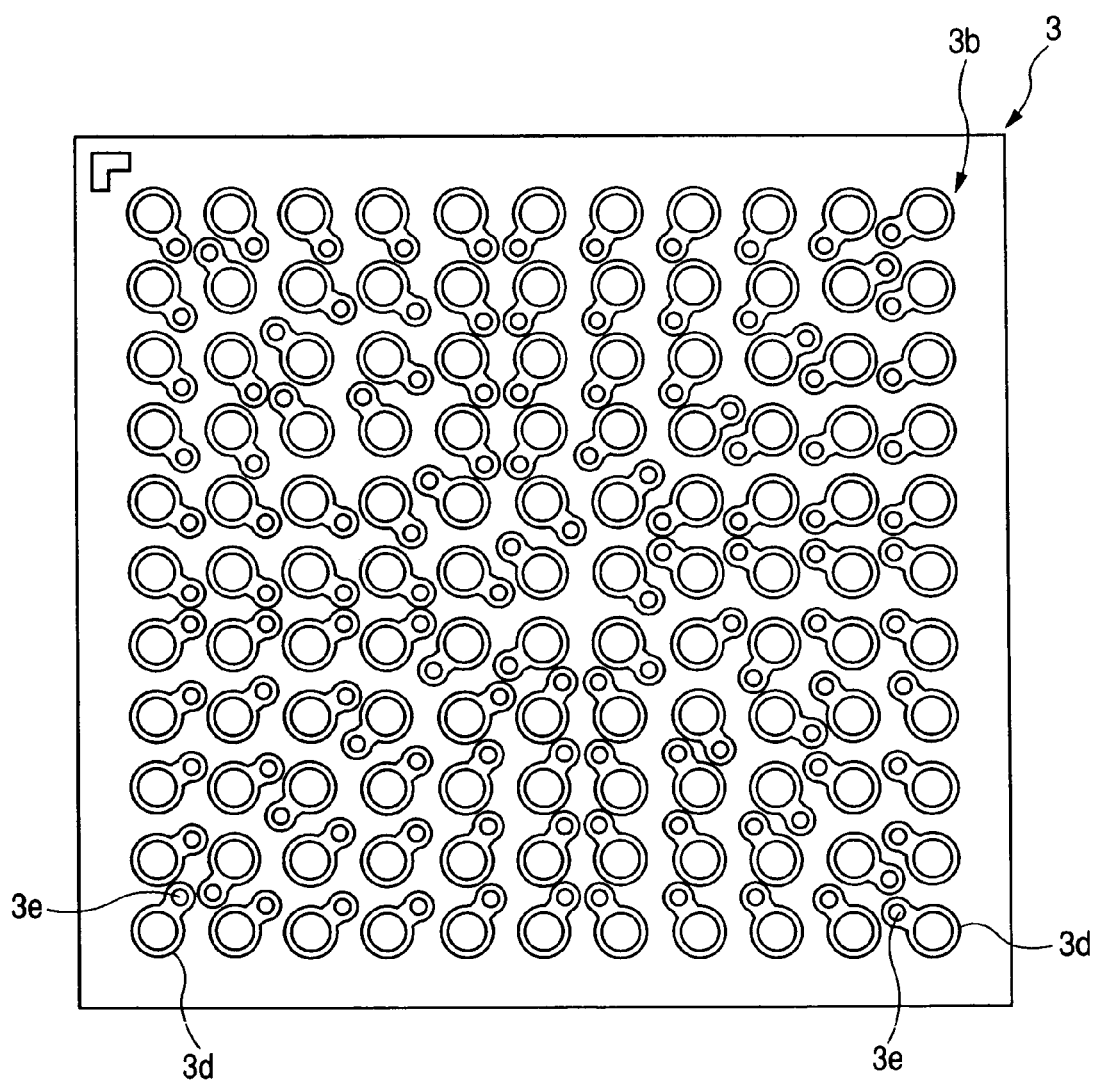
FIG. 7 is a back surface view showing one example of the wiring pattern on a back surface side of the printed wiring board shown in FIG. 4.
Figure 8:
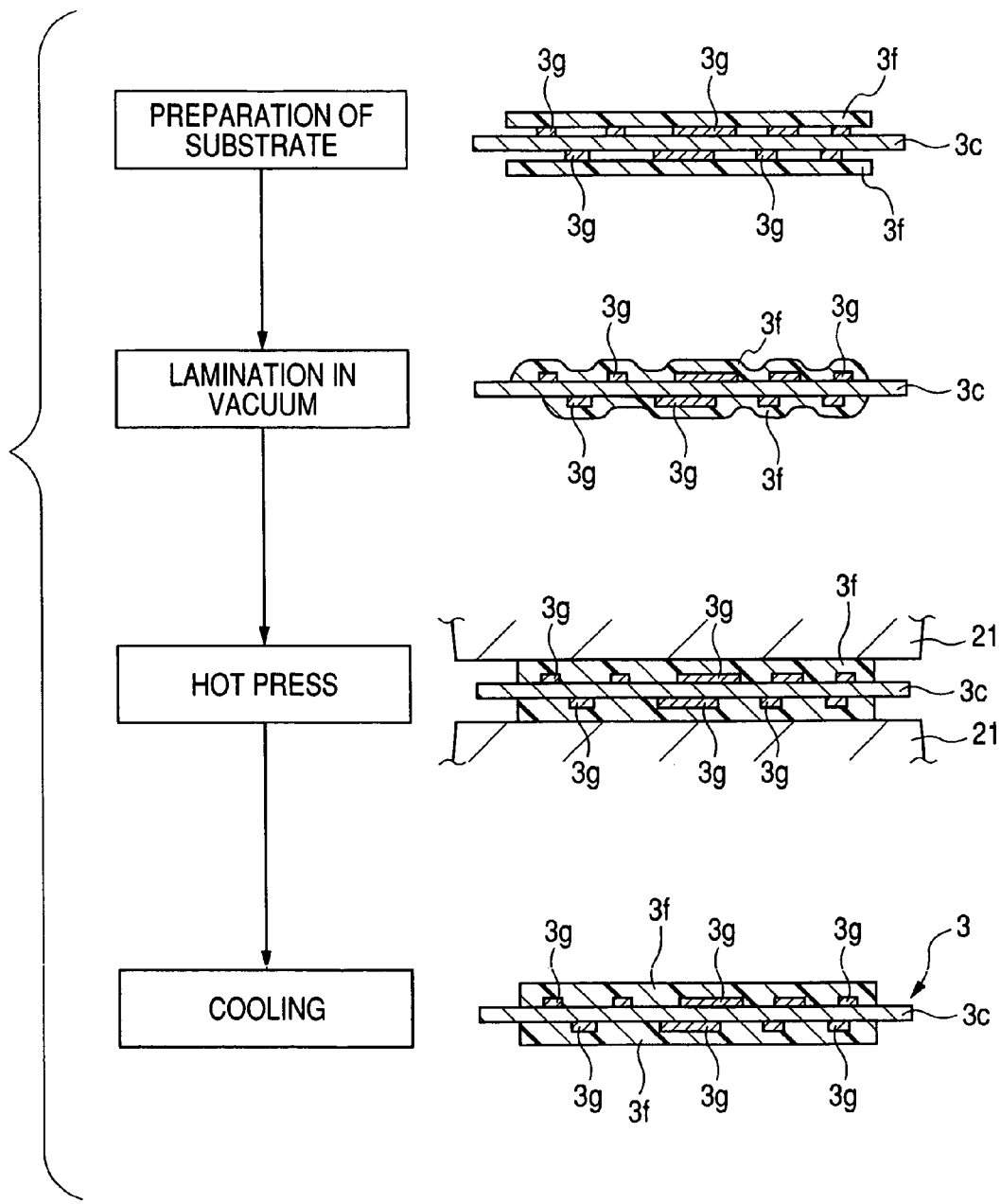
FIG. 8 is a manufacturing process flowchart showing one example of a forming method of a dry resist film in the printed wiring board shown in FIG. 4.
Figure 9:
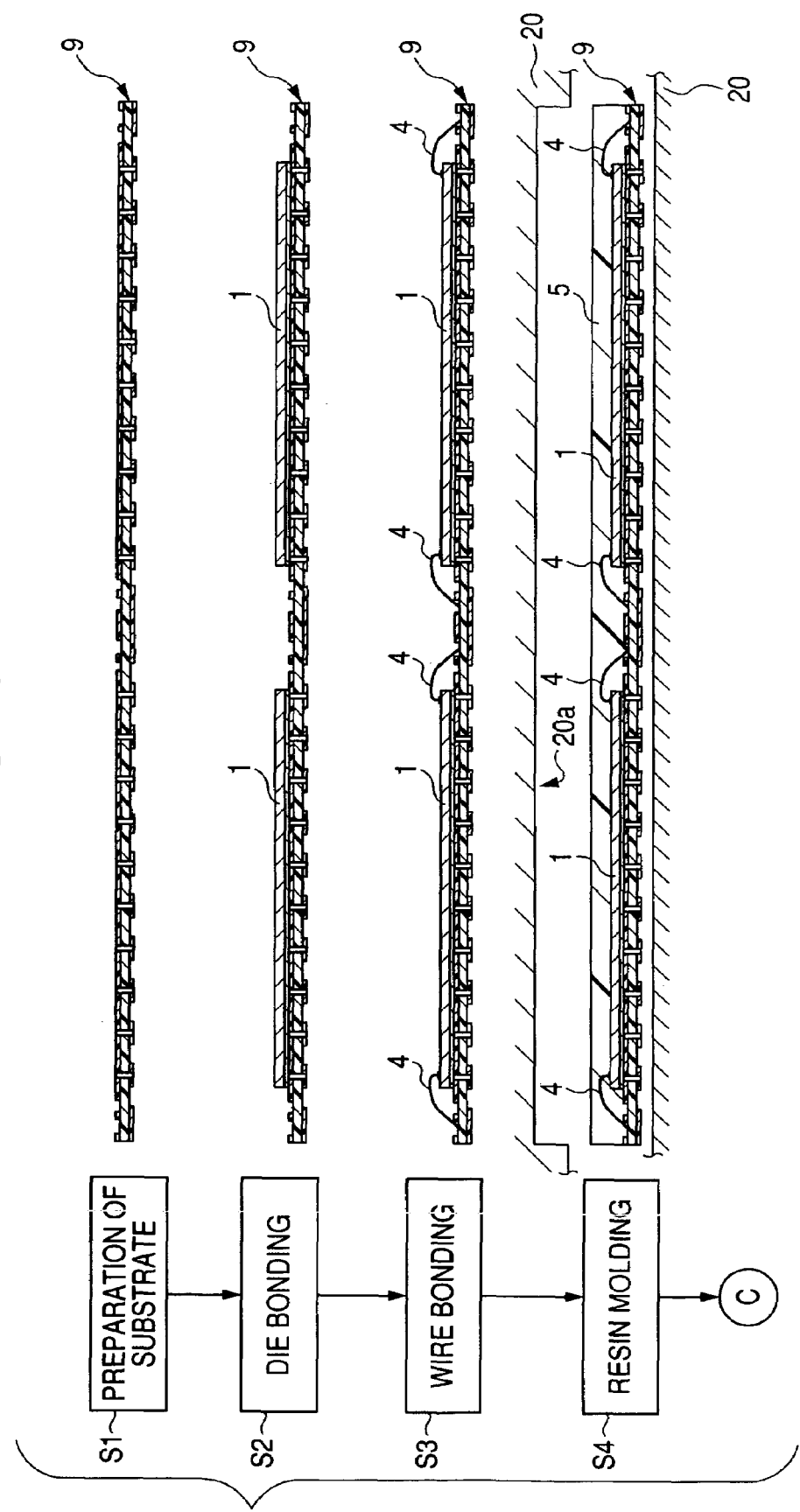
FIG. 9 is a manufacturing process flowchart showing one example of assembling until resin molding in the assembling of the semiconductor device shown in FIG. 1.
Figure 10:
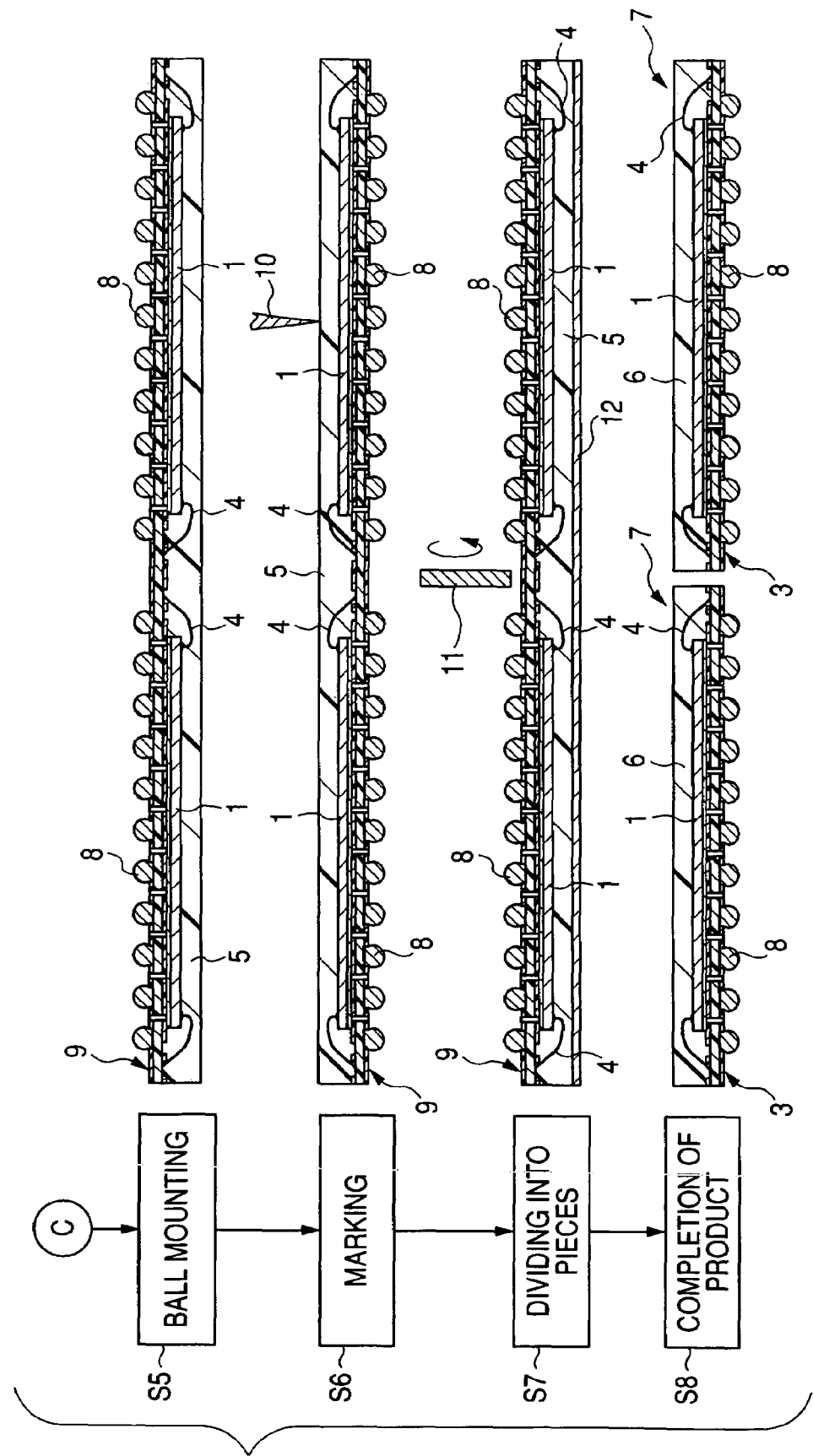
FIG. 10 is a manufacturing process flowchart showing one example of assembling after the resin molding in the assembling of the semiconductor device shown in FIG. 1.
Figure 11:
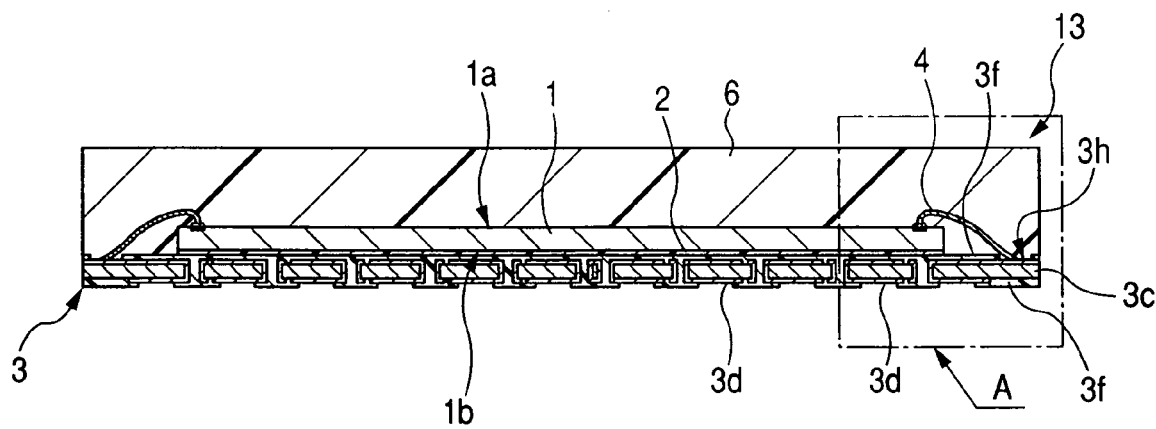
FIG. 11 is a cross-sectional view of the structure of a modification of the semiconductor device according to the embodiment 1 of the present invention.
Figure 12:
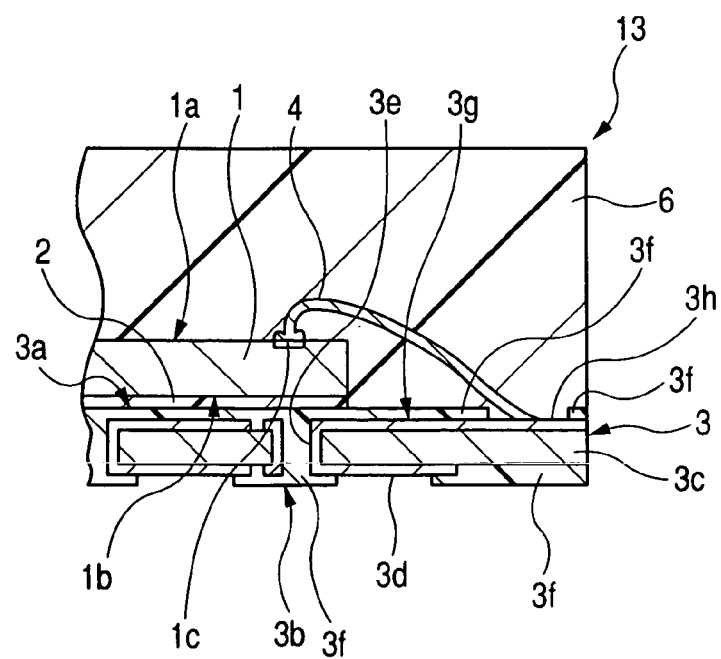
FIG. 12 is an enlarged partial cross-sectional view showing the structure of a part A shown in FIG. 11.

4, FIG. 6 is a plan view showing one example of wiring pattern on the front surface side of the printed wiring board shown in FIG. 4, FIG. 7 is a back surface view showing one example of the wiring pattern on the back surface side of the printed wiring board shown in FIG. 4, FIG. 8 is a manufacturing process flowchart showing one example of a forming method of the dry resist film in the printed wiring board shown in FIG. 4, FIG. 9 is a manufacturing process flowchart showing one example of assembling until the resin molding in the assembling of the semiconductor device shown in FIG. 1, FIG. 10 is a manufacturing process flowchart showing one example of assembling after the resin molding, FIG. 11 is a cross-sectional view of the structure of a modification of the semiconductor device according to the embodiment 1 of the present invention, and FIG. 12 is an enlarged partial cross-sectional view showing the structure of a part A shown in FIG. 11.

The semiconductor device according to the embodiment 1 is a resin-molding-type small-sized semiconductor package in which a semiconductor chip 1 is mounted on a printed wiring board. In the embodiment 1, a CSP (Chip Scale Package) 7 shown in FIG. 1 to FIG. 3 is explained as one example.

Here, in the CSP 7, soldered bumps 8 which constitute a plurality of external terminals are arranged on a back surface 3b of the printed wiring board in a grid array. Accordingly, the CSP 7 is a BGA (Ball Grid Array) type semiconductor package.

To explain the structure of the CSP 7 in conjunction with FIG. 1 to FIG. 3, the CSP 7 includes a package substrate 3 which is constituted of a printed wiring board having a main surface 3a, aback surface 3b which is arranged opposite to the main surface 3a, a plurality of conductor portions formed on the main surface 3a and the back surface 3b and a dry resist film 3f which is formed on the main surface 3a and the back surface 3b and covers some of the above-mentioned plurality of conductor portions and is also made of a film, a semiconductor chip 1 which is mounted on the main surface 3a of the package substrate 3 and includes an integrated circuit, conductive wires 4 which electrically connect pads 1c which constitute electrodes of the semiconductor chip 1 with bonding electrodes 3h of the package substrate 3, a die-bonding film 2 which constitutes a die-bonding material arranged between the main surface 3a of the package substrate 3 and the semiconductor chip 1 (preliminarily adhered to the back surface side of the semiconductor chip 1), soldered bumps 8 which constitute a plurality of external terminals formed on a plurality of lands 3d on the back surface 3b of the package substrate 3, and a sealing body 6 which seals the semiconductor chip 1 and the plurality of conductive wires 4 using resin. The semiconductor chip 1 is fixed to the dry resist film 3f of the main surface 3a formed on the package substrate 3 by way of the die-bonding film 2.

The CSP 7 is a small-sized semiconductor package, wherein the size of the semiconductor chip 1 and the size of the package substrate 3 are substantially equal, that is, the package substrate 3 is slightly larger than the semiconductor chip 1 in size. For example, a distance between an end portion of the semiconductor chip 1 and an end portion of the package substrate 3 is approximately 300 µm.

Accordingly, in the CSP 7, as shown in FIG. 1 and FIG. 3, a plurality of bonding electrodes 3h are arranged in a region outside the chip in the package substrate 3 and on a peripheral portion of the substrate, wherein pads 1c which constitute electrodes formed on the main surface 1a of the semiconductor chip 1 and the corresponding bonding electrodes 3h formed on the package substrate 3 are electrically connected with each other using the conductive wires 4.

Here, the structure of the package substrate 3 shown in FIG. 4 and FIG. 5 which is assembled into the CSP 7 is explained.

The package substrate 3 includes a core material 3c, a plurality of conductor portions formed on the main surface 3a and the back surface 3b of the core material 3c, through holes 3e which connect the conductor portions of the main surface 3a and the back surface 3b, and the dry resist film 3f which covers at least some of the above-mentioned conductor portions. The plurality of bonding electrodes 3h are arranged in the peripheral portion of the substrate on a row along the respective sides as shown in FIG. 6 on the main surface 3a which constitutes a front surface of the package substrate 3.

Further, the bonding electrodes 3h are electrically connected via through holes 3e and copper wirings 3g respectively.

On the other hand, on the back surface 3b of the package substrate 3, as shown in FIG. 7, a plurality of lands 3d are arranged in a grid array and the soldered bumps 8 which constitute the external terminals are connected with the lands 3d. Further, the plurality of lands 3d are respectively connected with the through holes 3e.

In this manner, on the main surface 3a and the back surface 3b of the package substrate 3, conductor portions such as the bonding electrodes 3h, the copper wirings 3g, the lands 3d and the through holes 3e are formed. These conductor portions are formed of copper alloy (Cu), for example. Further, for enhancing the connection strength of the plurality of lands 3d and the bonding electrodes 3h with the conductive wires 4, surface treatment such as Ni/Au plating or Ni/Pd/Au plating is applied to the copper alloy. A total thickness of the plating layer which is formed using such surface treatment is approximately 10 µm.

Here, on the main surface 3a and the back surface 3b of the package substrate 3, as shown in FIG. 5, the dry resist film 3f which constitutes a solder resist film (an insulation film) made of film is formed. The dry resist film 3f covers the conductor portions except for the bonding electrodes 3h and the lands 3d. Here, the dry resist film 3f has a thickness of, for example, approximately 25 µm. That is, the dry resist film 3f is thin compared to a wet type resist film (having, for example, a thickness of approximately 55 µm).

Further, the dry resist film 3f has a surface thereof more flattened or leveled compared to the wet type resist film.

Here, a method of forming the dry resist film 3f in the package substrate 3 is explained in conjunction with FIG. 8.

First of all, the core material 3c on which the copper wirings 3g are formed is prepared and the film-like dry resist film 3f is arranged on both of front and back surfaces of the core material 3c. Thereafter, the vacuum absorption is performed using a vacuum lamination method thus compression-bonding the film-like dry resist film 3f to the front and back surfaces of the core material 3c. Here, due to the vacuum absorption, bubbles contained in the inside of the dry resist films 3f can be removed.

Thereafter, using a hot press method, heat and load are applied to the film-like dry resist film 3f by a press 21 thus fixedly securing the dry resist film 3f to the core material 3c using the thermal compression bonding. Here, since the dry resist film 3f is pressurized by the press 21 having a flat pressurizing surface, the surface of the dry resist film 3f can be flattened or leveled.

Thereafter, the substrate is cooled thus completing the manufacturing of the leveled dry resist film 3f.

Since the wet type resist film is formed by coating which is followed by curing, the resist film is formed tracing the irregularities formed on the surface of the substrate. Accordingly, it is difficult to flatten or level the surfaces of the wet type resist film.

In this manner, the package substrate 3 which is assembled to the CSP 7 can flatten or level the surface thereof due to the adoption of the dry resist film 3f. The dry resist film 3f exhibits the smaller irregularities in thickness compared to the wet type resist film and hence, it is possible to easily control the thickness with the use of the dry resist film 3f. As a result, it is possible to reduce the warping of the package substrate 3.

Further, the dry resist film 3f can be formed with a total thickness thereof smaller than a thickness of the wet type resist film and hence, it is possible to achieve the reduction of the thickness of the package substrate 3.

Here, the film thickness and the warping direction of the substrate during the formation of the dry resist film 3f are explained. That is, the package substrate 3 which is assembled into the CSP 7 of the embodiment 1 adopts the dry resist film 3f which is made of a film and hence, it is possible to control the film thickness of the resist film 3f. By making the thickness of the dry resist film 3f different between the front and back surfaces thereof, it is possible to further reduce the warping of the board.

To be more specific, in considering wiring density of the copper wirings (conductor portions) 3g which are formed on the front and back surfaces of the substrate respectively, for example, when the wiring density is considered in view of an area of the copper wiring 3g, a thickness of the dry resist film 3f which is formed on the surface on which the area of the copper wiring 3g is smaller is set larger than a thickness of the dry resist film 3f which is formed on the opposite surface.

Alternatively, when the wiring density is considered in view of a length of the copper wiring 3g, a thickness of the dry resist film 3f which is formed on the surface on which the length of the copper wiring 3g is smaller is set larger than a thickness of the dry resist film 3f which is formed on the opposite surface.

In this manner, by changing the thickness of the dry resist film 3f between the front and back surfaces thereof corresponding to the wiring density (area or length) of the copper wiring (conductor portions) 3g, it is possible to control the warping direction of the package substrate 3 and, at the same time, it is possible to further reduce the warp.

Further, in the CSP 7 of the embodiment 1, by adopting the dry resist film 3f in the package substrate 3, as shown in FIG. 8, the surface of the package substrate 3 can be flattened or leveled. Accordingly, as shown in FIG. 3, even when a die-bonding film 2 is used as a die-bonding material which fixedly secures the semiconductor chip 1, there is no possibility that a gap is formed between the surface of the package substrate 3 and the die-bonding film 2 and hence, it is possible to fix the semiconductor chip 1 by way of the die-bonding film 2.

Here, it is preferable to use, for example, a dicing tape material as the die-bonding film 2. To explain the dicing tape material in detail, the dicing tape material has the two-layered structure which includes a core portion and an adhesive layer (first adhesive layer, UV adhesive material layer) formed on the core portion. In the embodiment 1, the die-bonding film 2 is not limited to this structure. For example, the dicing tape material is constituted of a core portion, an adhesive layer (first adhesive layer, UV adhesive material layer) formed on the core portion and, further, on top of the first adhesive layer, an adhesive layer (second adhesive layer, die-bonding adhesive material layer) which is formed on the previous adhesive layer and constitutes a die-bonding film 2. Here, for example, an adhesive layer of a dicing tape member which is used at the time of cutting a semiconductor wafer into pieces by dicing is left on a back surface of the wafer and this adhesive layer is used as the die-bonding film 2.

Accordingly, the semiconductor chip 1 can be fixedly secured to the main surface 3a of the package substrate 3 by way of the die-bonding film 2.

Here, the semiconductor chip 1 is made of, for example, silicon or the like and an integrated circuit is formed on the main surface 1a thereof. Further, as shown in FIG. 1, the pads 1c which constitute a plurality of electrodes are formed on the peripheral portion of the main surface 1a of the semiconductor chip 1. Further, the conductive wires 4 which electrically connect the pads 1c and the bonding electrodes 3h which are arranged on the peripheral portion of the main surface 3a of the package substrate 3 are formed of, for example, a gold wire or the like.

Further, as shown in FIG. 2 and FIG. 3, the semiconductor chip 1 is mounted on the package substrate 3 in a state that the back surface 1b of the semiconductor chip 1 is fixedly secured to the package substrate 3 by way of the die-bonding film 2 and the main surface 1a of the semiconductor chip 1 is directed upwardly.

Further, the sealing body 6 which seals the semiconductor chip 1 and the conductive wires 4 using the resin is made of, for example, a thermosetting epoxy resin or the like.

Next, a manufacturing method of the CSP 7 according to this embodiment 1 is explained in conjunction with a manufacturing process flowchart shown in FIG. 9 and FIG. 10.

First of all, the preparation of the substrate in step S1 shown in FIG. 9 is performed. Here, a multicavity substrate 9 on which regions for forming a plurality of package substrates 3 are defined and arranged is prepared. Here, in the region where the package substrate 3 is formed, copper wirings 3g and the dry resist film 3f which covers at least some of the copper wirings 3g are formed on both of front and back surfaces of the multicavity substrate 9.

Thereafter, the die-bonding shown in step S2 is performed so as to fixedly secure the semiconductor chips 1 to the multicavity substrate 9 by way of the die-bonding films 2 shown in FIG. 3. Here, the die-bonding film 2 is constituted of a die-bonding film which is formed by allowing an adhesive layer of die-bonding tape member which is used at the time of dividing the semiconductor wafer into pieces by dicing to remain on the back surface of the wafer.

Thereafter, the wire bonding shown in step S3 is performed. Here, as shown in FIG. 1 and FIG. 3, the pads 1c on the main surface 1a of the semiconductor chip 1 and the corresponding bonding electrodes 3h of the package substrate 3 of the multicavity substrate 9 are electrically connected using the conductive wires 4 such as gold wires or the like.

Thereafter, the resin molding shown in step S4 is performed. Here, on the multicavity substrate 9, the resin molding is performed in a state that a plurality of regions (device regions) on the multicavity substrate 9 are collectively covered with one cavity 20a of a resin forming mold 20 thus forming a collective sealing body 5. Here, the sealing resin which forms the collective sealing body 5 is, for example, a thermosetting epoxy resin or the like.

Thereafter, the ball mounting shown in step S5 in FIG. 10 is performed so as to connect the soldered bumps 8 to the respective lands 3d as shown in FIG. 3.

Thereafter, the marking shown in step S6 is performed. Here, the marking 10 is performed using a laser marking method or the like thus applying marks on the collective sealing body 5. Here, the marking 10 may be performed using an ink marking method or the like, for example.

Thereafter, the dividing of the multicavity substrate 9 shown in step S7 is performed. Here, the dicing tape 12 is adhered to a front surface of the collective sealing body 5 and the collective sealing body 5 is cut using a dicing blade 11 in a state that the collective sealing body 5 is fixed with the dicing tape 12 thus dividing the multicavity substrate 9 into the respective CSPs 7.

Accordingly, as shown in step S8, by performing the assembling of the CSP 7, the manufacturing of a product is completed. That is, the assembling of the CSP 7 which fixes the semiconductor chip 1 to the dry resist film 3f of the main surface 3a of the package substrate 3 by way of the die-bonding film 2 is completed.

According to the semiconductor device of this embodiment 1, since the dry resist film 3f constituted of a film is formed on the main surface 3a and the back surface 3b of the package substrate 3, it is possible to reduce the irregularities of the thickness of the dry resist film 3f compared to the wet type resist film and hence, it is possible to easily control the thickness of the resist film thus restricting the warping of the package substrate 3.

As a result, it is possible to prevent the formation of voids below the semiconductor chip and hence, it is possible to prevent the generation of package cracks at the time of performing the reflow mounting or the like.

Accordingly, the reliability of the CSP 7 can be enhanced.

Further, since the warping of the package substrate 3 can be suppressed, it is also possible to reduce the pealing-off of the semiconductor chip 1 from the substrate at the outer periphery of the substrate, the defective bonding and, further, the occurrence of troubles at the time of transporting the CSP7 in the assembling operation.

As a result, it is possible to enhance the quality of the CSP 7.

Further, since the dry resist film 3f made of a film is formed on the main surface 3a and the back surface 3b of the package substrate 3, it is possible to flatten or level the main surface 3a and the back surface 3b. Accordingly, in the CSP 7, the semiconductor chip 1 can be fixed to the dry resist film 3f on the main surface 3a of the package substrate 3 by way of the die-bonding film 2.

Accordingly, since it is unnecessary to use a paste material as the die-bonding material, it is no more necessary to consider the leaking of the paste material and hence, it is possible to set the distance between the end portion of the semiconductor chip 1 and the end portion of the package substrate 3 as short as possible thus realizing the miniaturization of the CSP 7.

Further, by adopting the dry resist film 3f in the package substrate 3, it is possible to enhance the positioning accuracy of the opening portions which are formed for allowing the bonding electrodes 3h to be exposed more accurately compared to the wet type resist film. Further, since burrs are not formed in the above-mentioned opening portions formed in the dry resist film 3f, it is possible to enhance the quality of the substrate.

Further, in the assembling of the CSP 7 which adopts the collective sealing method in which a plurality of device regions are collectively sealed using the resin, since the dry resist film 3f is formed on the package substrate 3, it is possible to reduce the initial warping of the substrate and hence, it is possible to further enlarge the size of the multi-cavity substrate 9 for collective sealing thus increasing the number of the CSPs 7 which can be manufactured out of the multicavity substrate 9.

Further, the dry resist film 3f which is formed of a film is formed on the main surface 3a and the back surface 3b of the package substrate 3 and hence, it is possible to fix the semiconductor chip 1 by way of the die-bonding film 2 whereby it is possible to further reduce the size of the device region thus realizing the further miniaturization of the CSP7. Particularly, the assembling of the CSP 7 which adopts the collective molding can realize the enlargement of the multicavity substrate 9 and hence, the smaller the package becomes, the more effective this embodiment 1 becomes.

Next, a modification of the embodiment 1 is explained.

The modification shown in FIG. 11 and FIG. 12 is directed to an LGA (Land Grid Array) type CSP 13, wherein external terminals formed on the back surface 3b of the package substrate 3 of the CSP 13 constitute lands 3d.

The structure of the CSP 13 is similar to the structure of the CSP 7 shown in FIG. 1 to FIG. 3 except for the external terminals. Accordingly, also in the LGA type CSP 13, it is possible to obtain similar advantageous effects as the advantageous effects obtained in the CSP 7 shown in FIG. 1 to FIG. 3.

Embodiment 2

Figure 13:
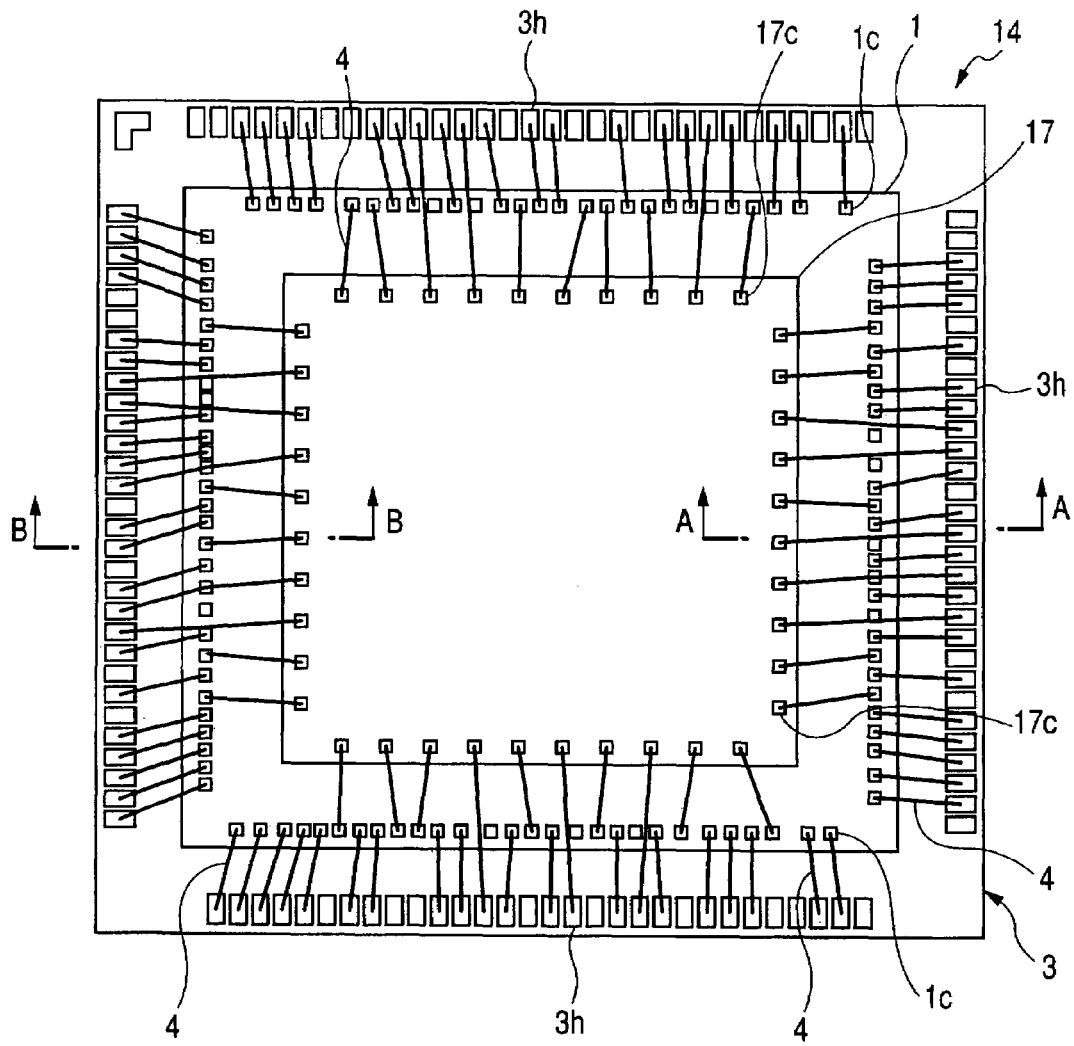
FIG. 13 is a plan view showing one example of the structure of a semiconductor device of an embodiment 2 according to the present invention as viewed through a sealing body in a see-through manner.
Figure 14:
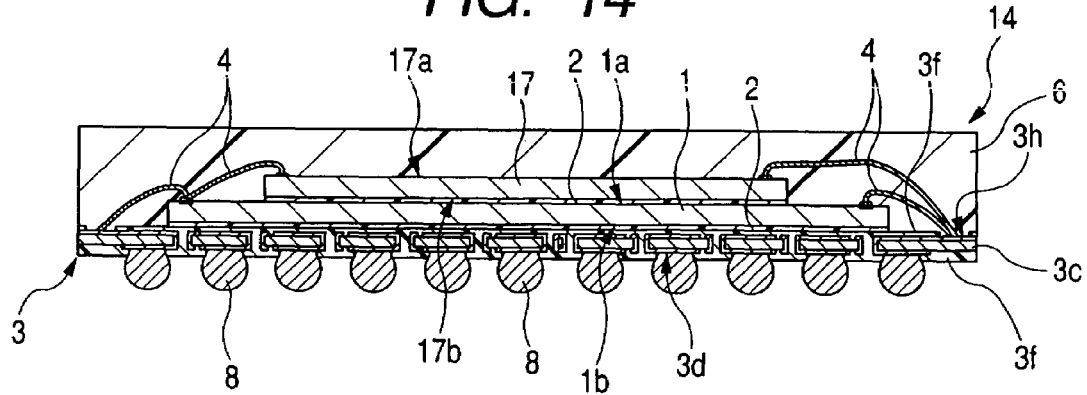
FIG. 14 is a cross-sectional view showing one example of the structure of the semiconductor device shown in FIG. 13.
Figure 15:
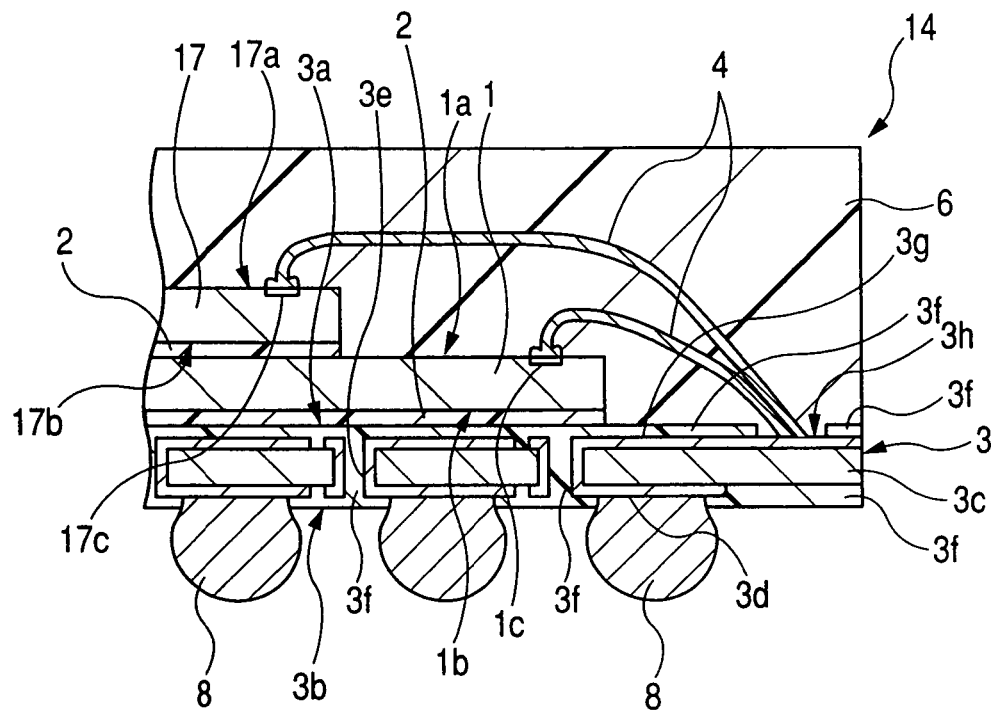
FIG. 15 is an enlarged partial cross-sectional view of the structure taken along a line A-A in FIG. 13.
Figure 16:
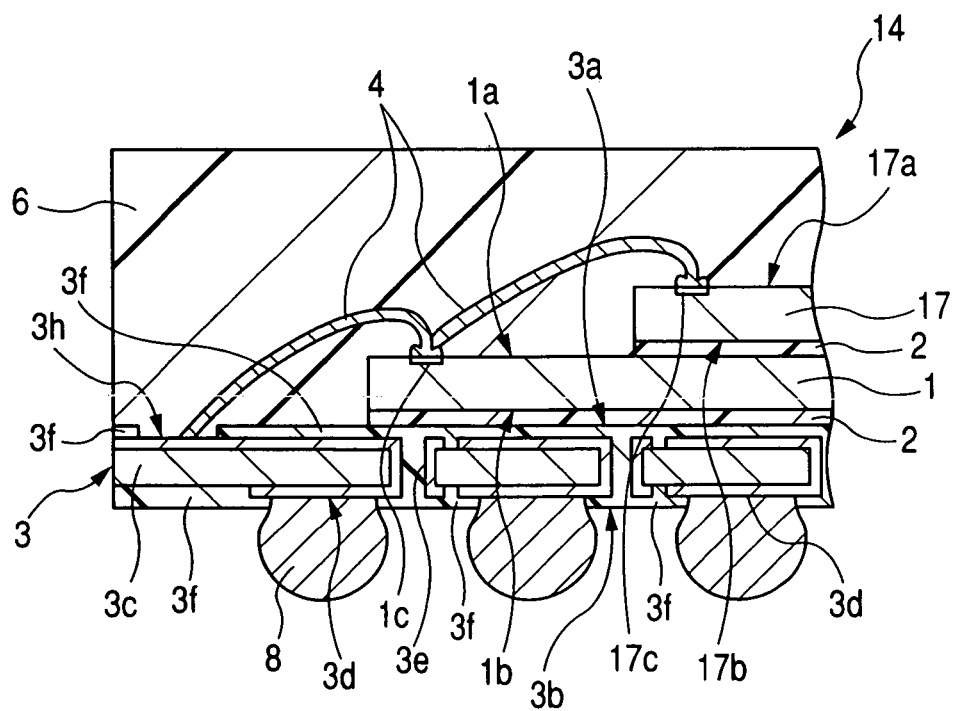
FIG. 16 is an enlarged partial cross-sectional view of the structure taken along a line B-B in FIG. 13.
Figure 17:
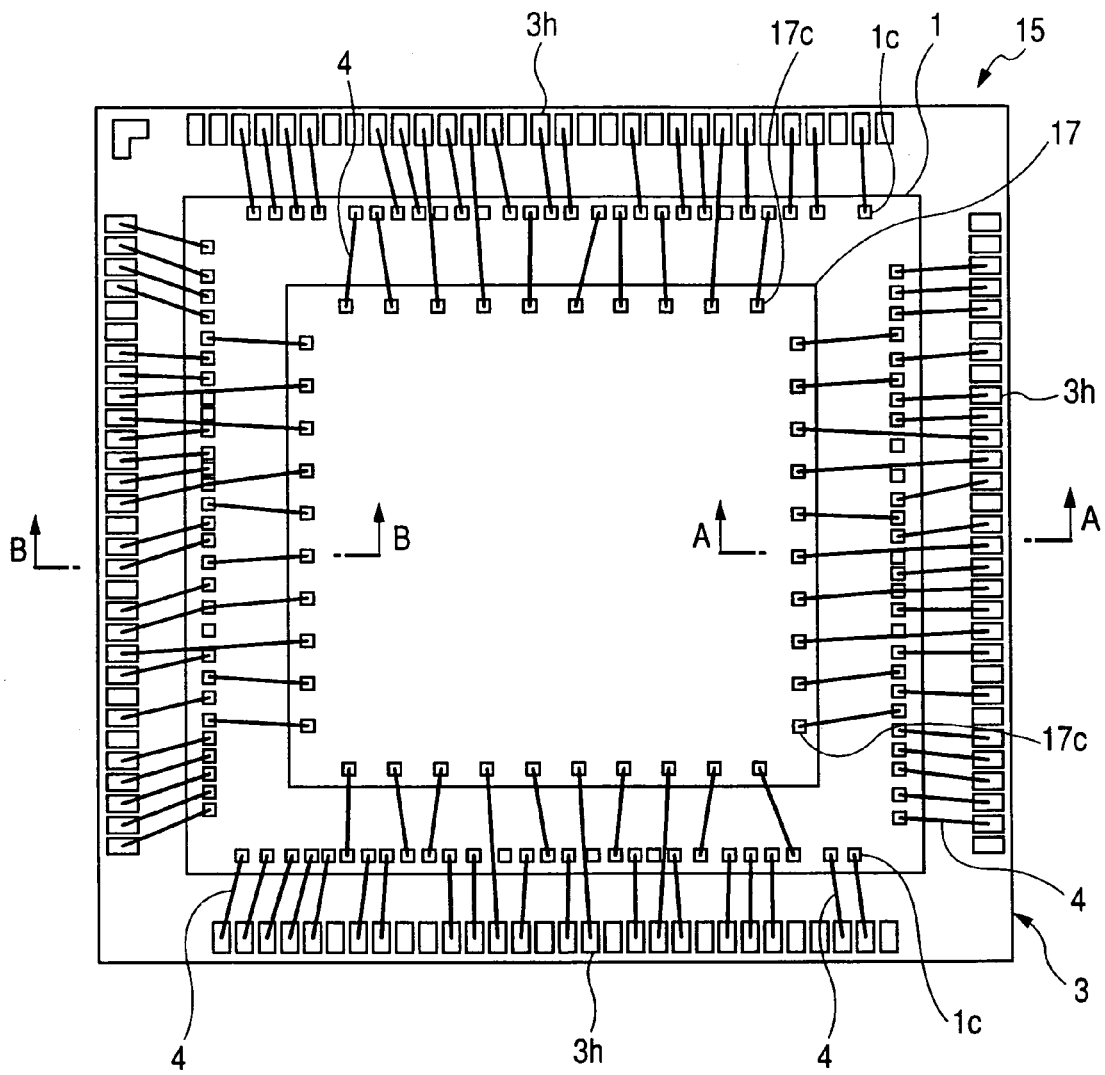
FIG. 17 is a plan view showing the structure of a modification of the semiconductor device of the embodiment 2 according to the present invention as viewed through a sealing body in a see-through manner.
Figure 18:
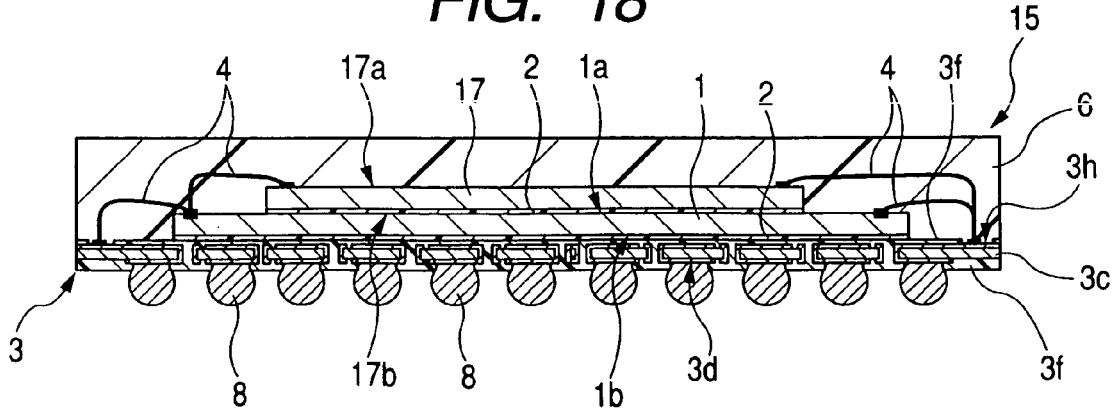
FIG. 18 is a cross-sectional view showing one example of the structure of the semiconductor device shown in FIG. 17.
Figure 19:
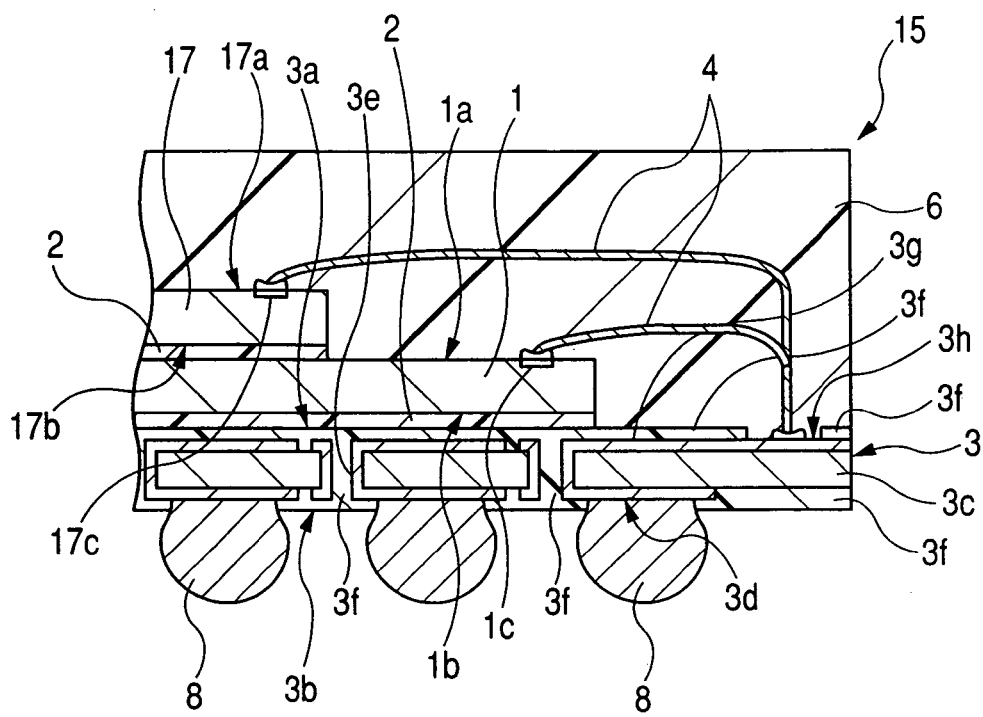
FIG. 19 is an enlarged partial cross-sectional view of the structure taken along a line A-A in FIG. 17.
Figure 20:
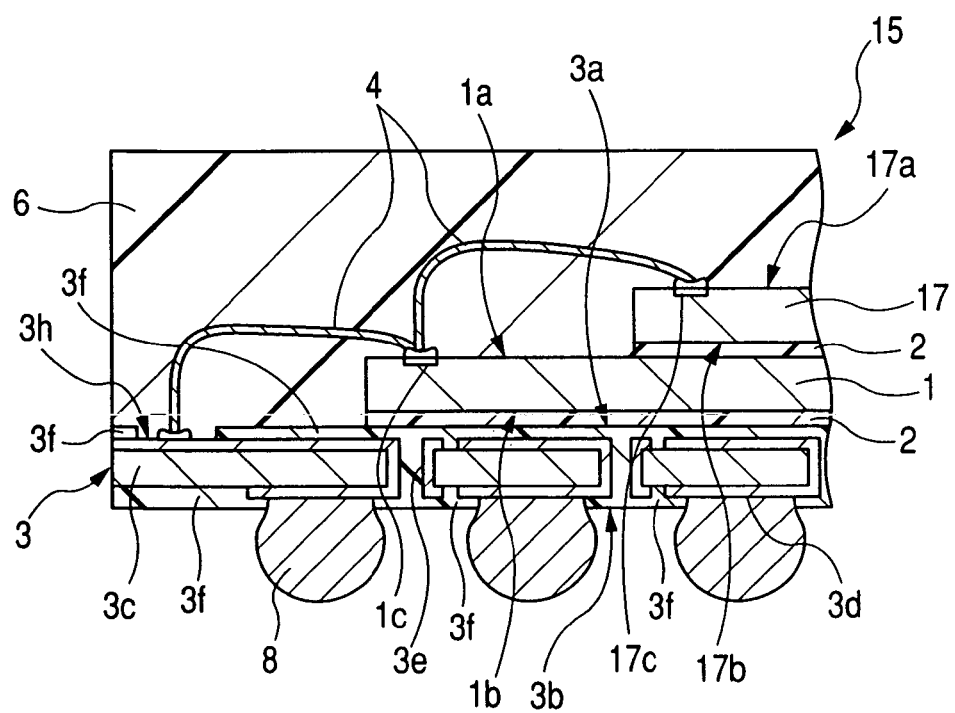
FIG. 20 is an enlarged partial cross-sectional view of the structure taken along a line B-B in FIG. 17.
Figure 21:
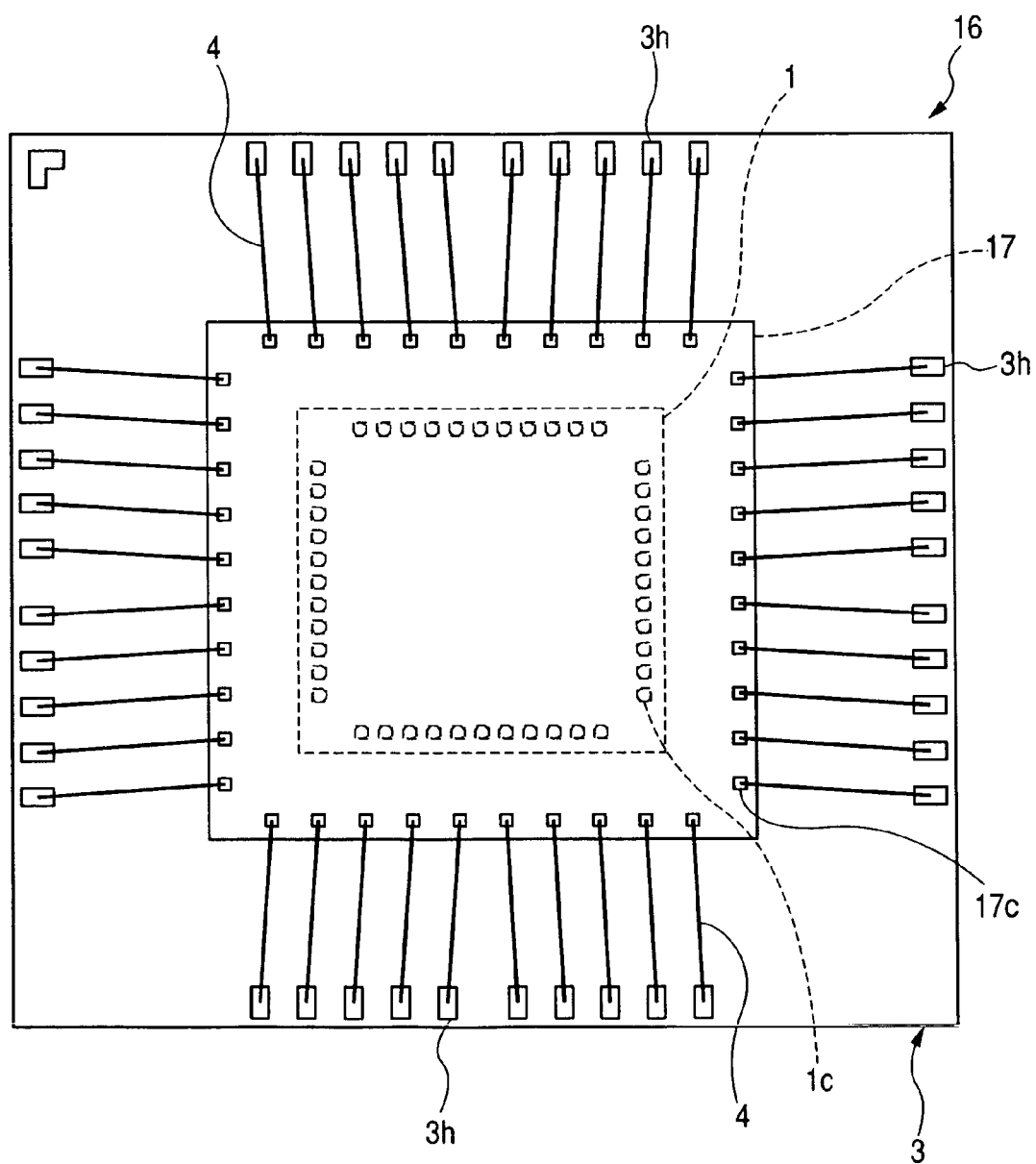
FIG. 21 is a plan view showing the structure of a modification of the semiconductor device of the embodiment 2 according to the present invention as viewed through a sealing body in a see-through manner.
Figure 22:
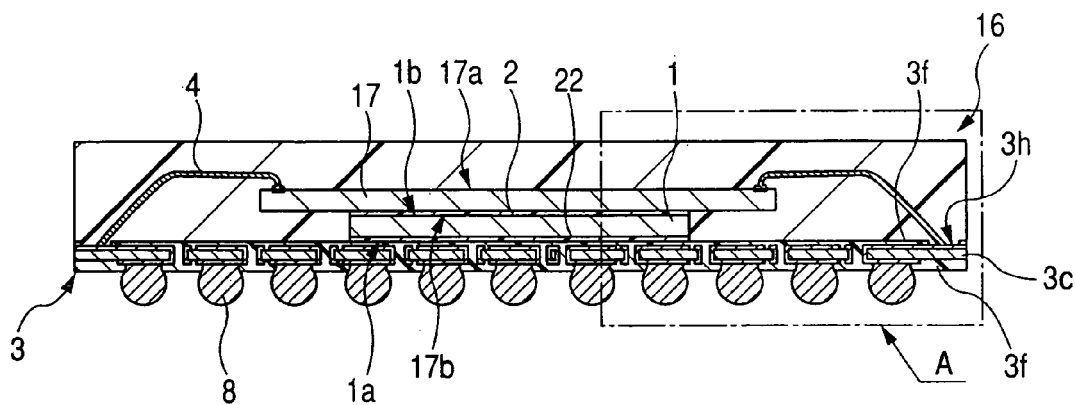
FIG. 22 is a cross-sectional view showing one example of the structure of the semiconductor device shown in FIG. 21.
Figure 23:
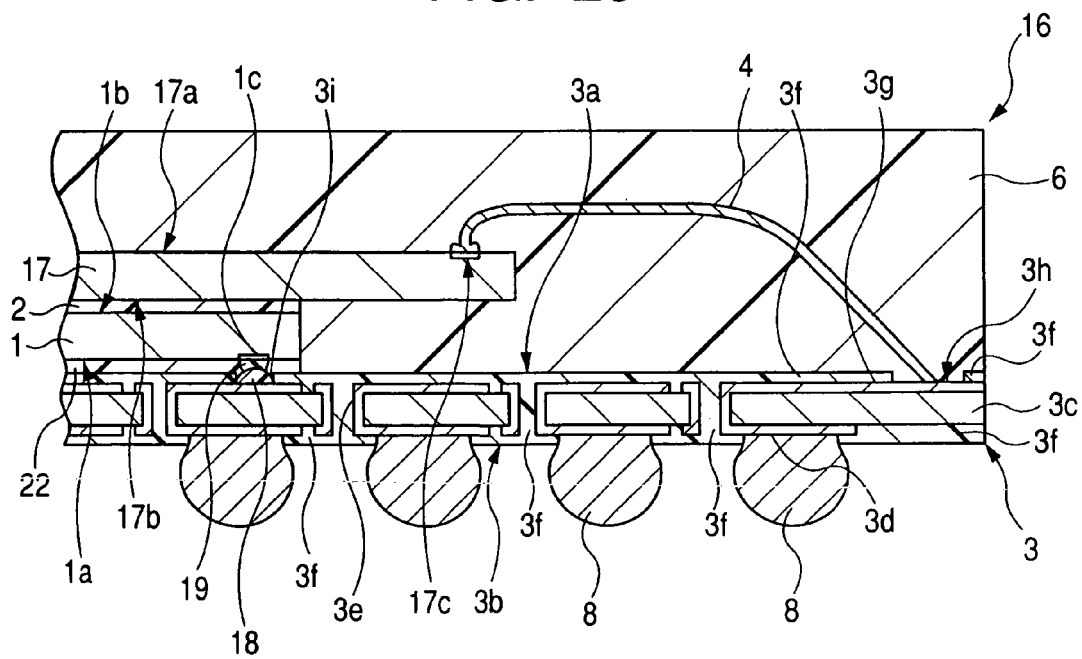
FIG. 23 is an enlarged partial cross-sectional view of the structure taken along a part A shown in FIG. 22.

FIG. 13 is a plan view showing one example of the structure of a semiconductor device of an embodiment 2 according to the present invention as viewed through a sealing body in a see-through manner, FIG. 14 is a cross-sectional view showing one example of the structure of the semiconductor device shown in FIG. 13, FIG. 15 is an enlarged partial cross-sectional view of the structure taken along a line A-A in FIG. 13, FIG. 16 is an enlarged partial cross-sectional view of the structure taken along a line B-B in FIG. 13, FIG. 17 is a plan view of a modification of the semiconductor device of the embodiment 2 according to the present invention as viewed through a sealing body in a see-through manner, FIG. 18 is a cross-sectional view showing one example of the structure of the semiconductor device shown in FIG. 17, FIG. 19 is an enlarged partial cross-sectional view of the structure taken along a line A-A in FIG. 17, FIG. 20 is an enlarged partial cross-sectional view of the structure taken along a line B-B in FIG. 17, FIG. 21 is a plan view of a modification of the semiconductor device of the embodiment 2 according to the present invention as viewed through a sealing body in a see-through manner, FIG. 22 is a cross-sectional view showing one example of the structure of the semiconductor device shown in FIG. 21, and FIG. 23 is an enlarged partial cross-sectional view of the structure taken along a part A shown in FIG. 22.

The semiconductor device of this embodiment 2 shown in FIG. 13 to FIG. 16 is configured such that a second semiconductor chip 17 is fixed to the semiconductor chip 1 by way of a die-bonding film 2 and is depicted as a CSP 14 which is of a resin molding type similar to the CSP 7 and has the small-sized chip stacked structure.

That is, as shown in FIG. 15 and FIG. 16, the dry resist film 3f is formed on the main surface 3a and the back surface 3b of the package substrate 3. A first-stage semiconductor chip 1 is mounted on the dry resist film 3f formed on the main surface 3a of the package substrate 3 by way of the die-bonding film 2 in face-up mounting in which a main surface 1a of the semiconductor chip 1 is directed upwardly, and a second-stage second semiconductor chip 17 is mounted on the first-stage semiconductor chip 1 in face-up mounting in which a main surface 17a of the second semiconductor chip 17 is directed upwardly. Here, the second semiconductor chip 17 also has a back surface 17b thereof fixed to the main surface 1a of the semiconductor chip 1 by way of the die-bonding film 2.

Here, pads 1c of the first-stage semiconductor chip 1 and pads 17c of the second-stage second semiconductor chip 17 are, as shown in FIG. 15, electrically connected with bonding electrodes 3h of the package substrate 3 respectively using the conductive wires 4. Alternatively, as shown in FIG. 16, the pads 1c of the first stage semiconductor chip 1 and the pads 17c of the second-stage second semiconductor chip 17 are electrically connected with each other using the conductive wires 4.

Here, in such connection of the chip and the substrate, the chip side constitutes a first bonding side, while the substrate side constitutes a second bonding side. Further, in the mutual connection of chips, as shown in FIG. 16, the second-stage-second-semiconductor-chip-17-side constitutes a first boding side, while the first-stage-semiconductor-chip-1-side constitutes a second bonding side.

In this manner, also in the CSP 14 having the chip stacked structure, the dry resist film 3f is formed on the main surface 3a and the back surface 3b of the package substrate 3 and hence, it is possible to fix the first stage semiconductor chip 1 and the second stage second semiconductor chip 17 to the package substrate 3 respectively by way of the die-bonding film 2, whereby it is possible to assemble both chips in similar environment thus simplifying a manufacturing process. That is, it is possible to realize the reduction of the manufacturing cost of the semiconductor device compared to a case in which the first step semiconductor chip 1 is fixed by way of a paste material and, further, the second stage second semiconductor chip 17 is fixed by way of a die-bonding film 2 using another die-bonding device.

Further, by fixing the first-stage semiconductor chip 1 using the die-bonding film 2, it is possible to reduce the mounting inclination of the first stage semiconductor chip 1 and hence, the highly reliable stacking can be realized.

Further, a semiconductor device according to a modification shown in FIG. 17 to FIG. 20 is represented as a CSP 15 having the miniaturized chip stacked structure similar to the structure of the CSP 14 shown in FIG. 13 to FIG. 16. The CSP 15 differs from the above-mentioned CSP 14 in that, when the chip and the substrate are connected with each other, the substrate side constitutes the first bonding side, while the chip side constitutes the second bonding side. Further, when the chips are connected with each other, as shown in FIG. 20, the first stage semiconductor chip 1 side constitutes the first bonding side, while the second stage second semiconductor chip 17 side constitutes the second bonding side.

Accordingly, the CSP 15 can manufacture the semiconductor device having the thickness smaller than the thickness of the semiconductor chip which is manufactured using the CSP 14.

Next, the semiconductor device according to a modification shown in FIG. 21 to FIG. 23 is represented as a CSP 16 having the miniaturized chip stacked structure similar to the structures of the CSP 14 and the CSP 15. However, as shown in FIG. 23, the first stage semiconductor chip 1 is connected by the flip-chip connection on the dry resist film 3f formed on the main surface 3a of the package substrate 3 and the second semiconductor chip 17 is stacked on the semiconductor chip 1.

That is, the semiconductor chip 1 is connected with flipping electrodes 3i on the main surface 3a of the package board 3 by way of solder projecting electrodes 18 and gold bumps 19 by the flip-chip connection. An underfill resin 22 is embedded in the flip-chip connecting portions. This underfill resin 22 may be a paste-like adhesive material or a film-like adhesive material.

Further, the second semiconductor chip 17 is stacked on the semiconductor chip 1 which is connected by way of the die-bonding film 2 by the flip-chip connection. This second semiconductor chip 17 is electrically connected with the bonding electrodes 3h of the package substrate 3 using the conductive wirings 4.

Also in the CSP 16, due to the formation of the dry resist films 3f on the main surface 3a and the back surface 3b of the package substrate 3, the warping of the package substrate 3 can be reduced and hence, it is possible to stabilize the flip-chip connection of the first stage semiconductor chip 1. The CSP 16 which has such chip stacking structure in which the first stage semiconductor chip 1 is connected by the flip-chip connection can realize a higher operational speed of the semiconductor device compared to the CSP 14.

Embodiment 3

FIG. 24 is a manufacturing process flowchart showing one example of assembling after the resin molding.

In the embodiment 3, the ball mounting is performed after the marking is performed.

In the ball mounting step, after solder is applied to the lands 3d of the package substrate 3, the soldered bumps 8 are formed by the reflow treatment. Accordingly, also in the ball mounting step, there arises a drawback that the package substrate 3 is further warped due to the reflow treatment. In the marking step, the marking is performed using a laser marking method or the like. However, in a state that the package substrate 3 is warped, it is difficult to irradiate the surface of the collective sealing body 5 with laser beams perpendicularly and hence, there arises the defective marking in which marks are not applied to the surface of the collective sealing body 5.

In view of the above drawback, in the embodiment 3, before performing the reflow treatment in the formation of the soldering bumps 8 which is one of the causes of the occurrence of warping of the package substrate 3, the marking step is performed as a preceding step. Accordingly, it is possible to suppress the defective marking.

The invention made by the inventors of the present invention has been specifically explained based on the embodiments of the invention heretofore. However, the present invention is not limited to the above-mentioned embodiments of the invention and it is needless to say that various modifications can be made without departing from the scope of the present invention.

For example, in the semiconductor device having the chip stacking structure explained in the above-mentioned embodiments 2, the fixing of the second stage second semiconductor chip 17 is not limited to the fixing which uses the die-bonding film 2, and the second stage second semiconductor chip 17 may be fixed using a paste-like adhesive material, for example.

The present invention is suitable for the electronic device which includes the printed wiring board and the manufacturing technique thereof.

What is claimed is:

1. A semiconductor device comprising:
   a printed wiring board having a main surface, a back surface opposing to the main surface, a plurality of conductor portions formed over the main surface and the back surface, respectively, and a resist film covering the plurality of conductor portions such that a part of each of the plurality of conductor portions is exposed from the resist film;
   a first semiconductor chip, having a main surface, a back surface opposing to the main surface, and a plurality of electrodes formed over the main surface, the first semiconductor chip being mounted over the main surface of the printed wiring board;

a die-bonding film arranged between the main surface of the printed wiring board and the back surface of the semiconductor chip;

a plurality of conductive wires electrically connecting the plurality of electrodes with the part of each of the plurality of conductor portions, respectively, wherein the part of each of the plurality of conductor portions is arranged around the first semiconductor chip; and wherein the back surface of the first semiconductor chip is fixed to the resist film formed over the main surface of the printed wiring board by way of the die-bonding film.

2. The semiconductor device according to claim 1, wherein, of the main surface and the back surface of the printed wiring board, a thickness of the resist film formed over the surface whose conductive portions have a smaller area is set greater than a thickness of the resist film formed over the surface whose conductive portions have a larger area.

3. The semiconductor device according to claim 1, wherein, of the main surface and the back surface of the printed wiring board, a thickness of the resist film formed over the surface whose conductive portion has a shorter length is set greater than a thickness of the resist film formed over the surface whose conductive portions have a longer length.

4. The semiconductor device according to claim 1, wherein the resist film is comprised of a dry type.

5. The semiconductor device according to claim 1, wherein the conductive portions of the printed wiring board include copper wirings.

6. The semiconductor device according to claim 1, wherein a second semiconductor chip is fixed to the first semiconductor chip by way of a die-bonding film.

7. The semiconductor device according to claim 6, wherein the first semiconductor chip and the second semiconductor chip are electrically connected with each other through electrodes and conductive wires of the printed wiring board.

8. The semiconductor device according to claim 1, wherein the first semiconductor chip is mounted in a state such that the main surface thereof faces the main surface of the printed wiring board in an opposed manner.

* * * * *